(12) United States Patent
Kobayashi et al.

(10) Patent No.: US 6,545,336 B2
(45) Date of Patent: Apr. 8, 2003

(54) SEMICONDUCTOR DEVICE, AND METHOD OF MANUFACTURING THE SAME

(75) Inventors: Hiromichi Kobayashi, Tokyo (JP); Takanori Sasaki, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 196 days.

(21) Appl. No.: 09/754,117

(22) Filed: Jan. 5, 2001

(65) Prior Publication Data

US 2002/0000632 A1 Jan. 3, 2002

(30) Foreign Application Priority Data

Jun. 30, 2000 (JP) .......................... 2000-197552

(51) Int. Cl.$^7$ .......................... H01L 27/10; H01L 29/00
(52) U.S. Cl. .................. 257/499; 257/797; 257/401
(58) Field of Search ............... 257/499, 797, 257/401

(56) References Cited

U.S. PATENT DOCUMENTS 6,020,616 A * 2/2000 Bothra et al.
6,215,197 B1 * 4/2001 Iwamatsu
6,396,158 B1 * 5/2002 Travis et al.
6,414,387 B1 * 7/2002 Hara et al.
6,465,290 B1 * 10/2002 Suguro et al.

FOREIGN PATENT DOCUMENTS

JP          11-330223          11/1999

* cited by examiner

*Primary Examiner*—Stephen D. Meier
(74) *Attorney, Agent, or Firm*—McDermott, Will & Emery

(57) ABSTRACT

There is described a semiconductor device which has an isolation region, the isolation region being polished by means of chemical-and-mechanical polishing, and which prevents occurrence of variations in a finished state of active regions even in a case where a large isolation area is present. An isolation region for separating active regions is formed on a semiconductor wafer. An annular dummy pattern is formed in an inactive region of greater than a predetermined size, so as to surround the isolation region. An isolation region is ensured between the active regions surrounding the inactive region and the dummy pattern.

9 Claims, 3 Drawing Sheets

SEMICONDUCTOR DEVICE, AND METHOD OF MANUFACTURING THE SAME

BACKGROUND OF THE INVENTION

1. Field of the Invention

The present invention relates to a semiconductor device and a method of manufacturing the same, and more particularly, to a semiconductor device whose isolation regions are flattened by means of chemical-and-mechanical polishing (hereinafter called simply "CMP") as well as to a method of manufacturing the semiconductor device.

2. Description of the Background Art

FIG. 6 is a plan view showing a semiconductor wafer processed according to a conventional manufacturing method. As shown in FIG. 6, reference numeral 10 designates an isolation region formed by means of the trench isolation technique. Reference numeral 12 designates active regions separated by the isolation region 10. FIG. 7 is a cross-sectional view for describing the conventional trench isolation technique for forming on a semiconductor wafer the isolation region 10 shown in FIG. 6.

According to the trench isolation technique, a nitride film 16 is formed on a silicon layer 14 of the semiconductor wafer. Next, a trench 18 which is to become the isolation region 10 is formed in the silicon layer 14 and the nitride film 16. Next, an oxide is deposited over the entire surface of a semiconductor wafer so as to be embedded in the trench 18. Finally, undesired oxides are removed by means of CMP while the nitride film 16 is used as a stopper film. As a consequence, oxides remain only within the trench 18, thus forming the isolation region 10 which separates the isolation regions 12.

A CMP operation employed in the course of forming the isolation region 10 is performed on condition that an oxide film is abraded at a higher rate than is a nitride film. For this reason, a so-called dishing phenomenon arises in the isolation region 10 when the isolation region 10 occupies a comparatively large area of the semiconductor wafer, as shown in FIG. 7.

If a dishing phenomenon arises in a specific isolation region 10, intensive force arises in the active regions 12 adjoining the isolation region 10. Consequently, the nitride film 16 covering the active regions 12 that undergo intensive stress is abraded much more than is the nitride film 16 covering other regions. As mentioned above, in a case where a large isolation region 10 is present, the structure of a conventional semiconductor device and the conventional trench isolation technique pose a problem of an active region being apt to vary in its finished state.

SUMMARY OF THE INVENTION

The present invention has been conceived to solve the foregoing problem and is aimed at providing a semiconductor device which prevents occurrence of variations in a finished state of active regions even in a case where a large isolation area is present.

The present invention is also aimed at providing a method of manufacturing a semiconductor device, which device prevents occurrence of variations in a finished state of active regions even in a case where a large isolation area is present.

The above objects of the present invention are achieved by . . . . The . . . includes.

The above objects of the present invention are achieved by . . . . The . . . includes.

Other objects and further features of the present invention will be apparent from the following detailed description when read in conjunction with the accompanying drawings.

DESCRIPTION OF THE PREFERRED EMBODIMENTS

Figure 1:
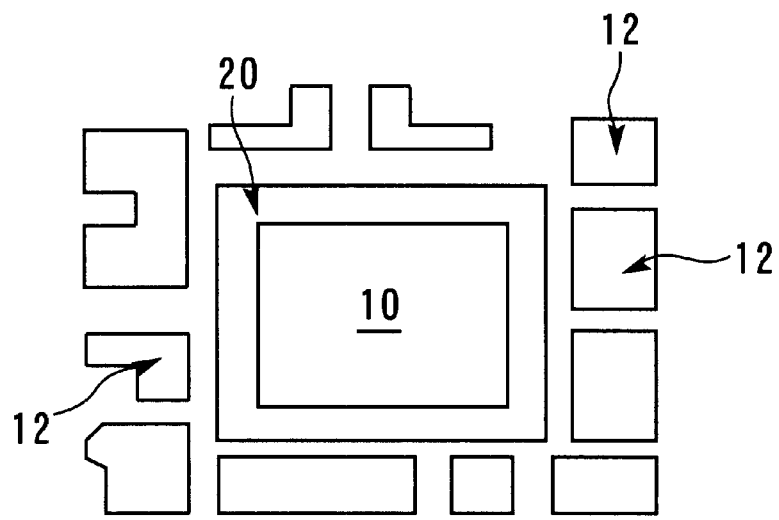
FIG. 1 is a plan view showing a semiconductor wafer processed by a manufacturing method according to a first embodiment of the present invention.

A preferred embodiment of the present invention will be described hereinbelow by reference to the accompanying drawings. Throughout the drawings, like reference numerals designate like elements, and repetition of their explanations is omitted.

FIG. 1 is a plan view showing a semiconductor wafer processed by a manufacturing method according to a first embodiment of the present invention. As shown in FIG. 1, a plurality of active regions 12 are formed on the surface of a semiconductor wafer. In the area where no active region 12 is formed; that is, in an inactive region on the semiconductor wafer are formed an isolation region 10 and a dummy pattern 20. The dummy pattern 20 is an annular pattern having no electrical function, and being formed in an inactive region having greater size than a predetermined size such that an isolation region 10 of predetermined width is formed between the dummy pattern 20 and active regions 12.

Figure 2:
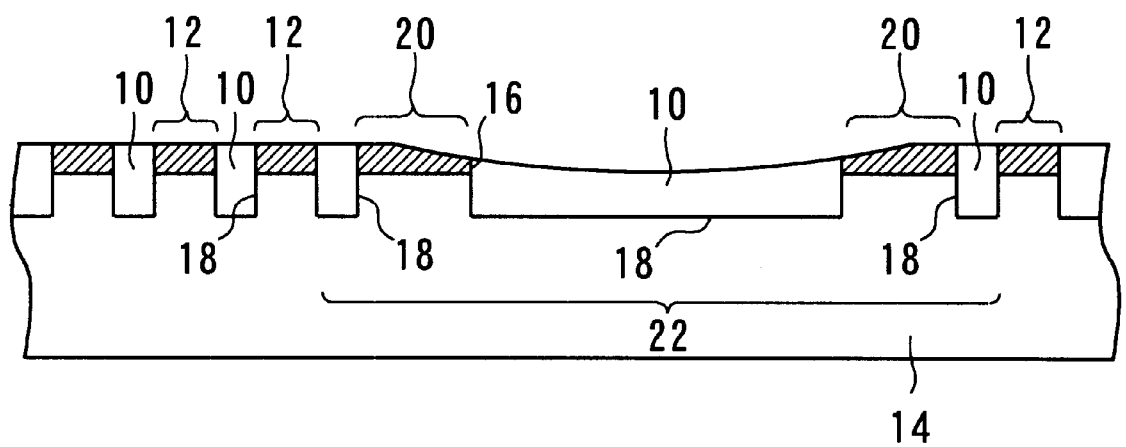
FIG. 2 is a cross-sectional view showing the semiconductor wafer shown in FIG. 1.

FIG. 2 is a cross-sectional view showing the semiconductor wafer shown in FIG. 1. Next will be described the method of manufacturing a semiconductor device according to the present embodiment, by reference to FIG. 2. As shown in FIG. 2, according to the manufacturing method of the present embodiment, the nitride film 16 is formed on the silicon layer 14 of the semiconductor wafer. Further, the trench 18 which is to become the isolation region 10 is formed in the silicon layer 14 and the nitride film 16. At this time, in the inactive region 22 having greater size than a predetermined size, there are formed trenches 18 in an area surrounded by the dummy pattern 20 and an area between the dummy pattern 20 and the active regions 12.

An oxide is deposited over the entire surface of the semiconductor wafer so as to be embedded in the trenches 18. At this time, the oxide is deposited not only in the trenches 18 but also on the surface of the nitride film 16.

In order to remove undesired oxides deposited on the surface of the nitride film 16, the semiconductor wafer is subjected to CMP. As a consequence, oxides remain in only the trench 18, whereby the isolation region 10 is formed in the areas between the individual active regions 12, the areas between the active regions 12 and the dummy pattern 20, and the area surrounded by the dummy pattern 20.

In the present embodiment, the CMP operation is performed while the nitride film 16 is taken as a stopper film. For this reason, the CMP operation is performed on condition that the oxide film is abraded at a higher rate than is the nitride film 16. During the CMP operation, a recess attributable to a so-called dishing phenomenon is apt to be formed in the isolation region 10 formed within the dummy pattern 20; that is, the isolation region 10 of a comparatively large area. In the present embodiment, since the width of the isolation region 10 located between the dummy pattern 20 and the active regions 12 is set so as not to cause a dishing phenomenon, no recess attributable to a dishing phenomenon is formed in the isolation region 10.

FIG. 2 shows a recess which is formed by means of a dishing phenomenon in the isolation region 10 surrounded by the dummy pattern 20. If such a recess is formed in the isolation region 10, during a CMP operation intensive force arises in the nitride film 16 of the dummy pattern 20 adjoining the isolation region 10. At a point in time when smoothing of the surface of the semiconductor substrate using CMP is completed, the nitride film 16 of the dummy pattern 20 has become thinner than the nitride film 16 of the active regions 12, especially along the inner periphery thereof.

In contrast, during the course of the CMP operation, substantially uniform force acts on the nitride film 16 formed outside the dummy pattern 20; that is, the nitride film 16 formed over the active regions 12. For this reason, according to the manufacturing method of the present embodiment, the nitride film 16 covering the active regions 12 can be made substantially uniform over the entire semiconductor wafer.

In the present embodiment, no electrical function is imparted to the dummy pattern 20. Therefore, variations in the thickness of the nitride film 16 covering the dummy pattern 20 do not affect the characteristic of the semiconductor device at all. Accordingly, the manufacturing method and the structure of the semiconductor device according to the present embodiment enables materialization of a semiconductor device having a stable characteristic and the active regions 12 uniformly formed over the entire surface of a semiconductor chip.

Figure 3:
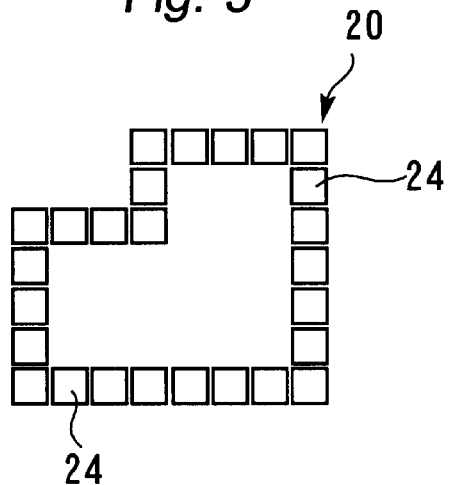
FIG. 3 is a plan view for describing a proffered variation of the first embodiment.

In the first embodiment, the dummy pattern 20 is limited to a continuous annular pattern. However, the present invention is not limited to such an embodiment. More specifically, as shown in FIG. 3, the dummy pattern 20 may be embodied by means of arranging a plurality of isolated patterns 24 into an annular layout.

Figure 4A:
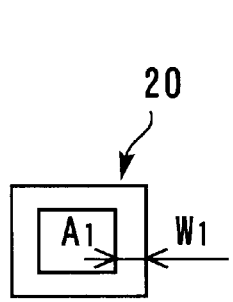
FIGS. 4A and 4B are plan views for describing a method for determining width of a dummy pattern in the first embodiment.
Figure 4B:
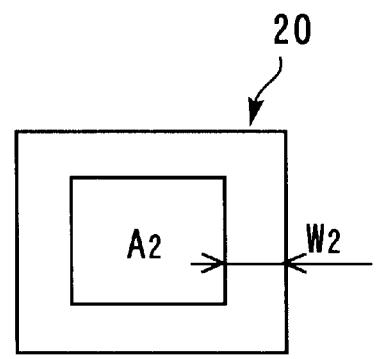

In the present embodiment, the width of the dummy pattern 20 is set to an arbitrary value. However, the width of the dummy pattern 20 may be determined by the size of the isolation region 10 formed inside the dummy pattern 20 or by the size of the inactive region 22 in which the dummy pattern 20 is located. As shown in FIGS. 4A and 4B, in a case where the isolation region 10 and the inactive region 22 have small areas (designated by, for example, $A_1$), the width of the dummy pattern 20 may be made small ($W_1$). In contrast, in a case where the isolation region 10 and the inactive region 22 have large areas (designated by, for example, $A_2$), the width of the dummy pattern 20 may be made large ($W_2$).

Figure 5:
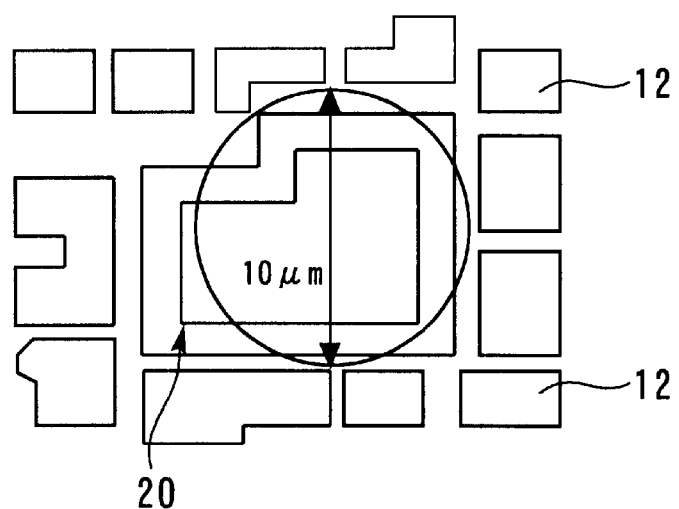
FIG. 5 is a plan view for describing a method for selecting inactive regions in which dummy patterns are to be formed in the first embodiment.
Figure 6:
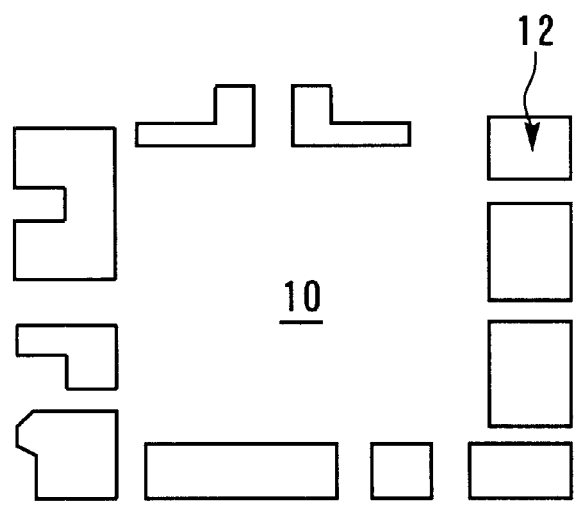
FIG. 6 is a plan view showing a semiconductor wafer processed according to a conventional manufacturing method.
Figure 7:
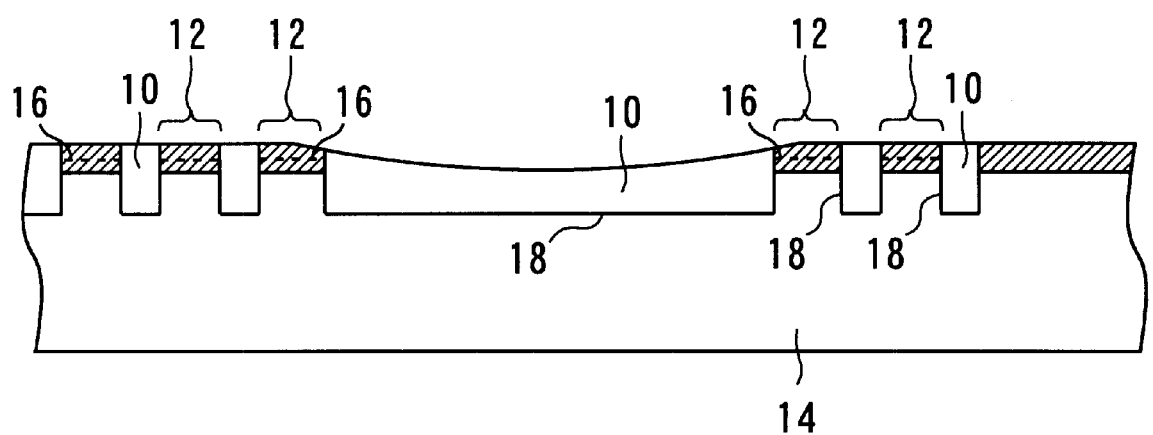
FIG. 7 is a cross-sectional view of the semiconductor wafer shown in FIG. 6.

In the previous embodiment, the dummy pattern 20 is formed within the inactive region 22 having greater size than a predetermined size. The predetermined size may be limited to a size in which a circle having a diameter of 10 μm or more can be formed, as shown in FIG. 5. By means of such a limitation, the dummy pattern 20 can be arranged in only the area where an actual effect is expected.

Since the present invention is configured in the manner as mentioned above, the following advantages are yielded.

According to a first aspect of the present invention, a dummy pattern is formed within an inactive region having greater size than a predetermined size. A recess may arise in an isolation region surrounded by the dummy pattern, for reasons of a dishing phenomenon during the course of formation of the dummy pattern. Even in such a case, an adverse effect which would be caused by the recess is absorbed by the dummy pattern. Therefore, all active regions are formed uniformly.

According to a second aspect of the present invention, no electrical function is imparted to the dummy pattern. Therefore, the characteristic of a semiconductor device can be made stable regardless of the state of a dummy pattern.

According to a third aspect of the present invention, the width of a dummy pattern is changed in accordance with the size of an isolation region which is to be surrounded by the dummy pattern. As a consequence, a wasteful dummy pattern region is minimized, and active regions can be efficiently protected.

According to a fourth aspect of the present invention, a dummy pattern can be formed in only the inactive region where a dishing phenomenon would arise. For this reason, according to the present invention, active regions can be efficiently protected without involvement of formation of a wasteful dummy pattern.

Further, the present invention is not limited to these embodiments, but variations and modifications may be made without departing from the scope of the present invention.

The entire disclosure of Japanese Patent Application No. 2000-197552 filed on Jun. 30, 2000 including specification, claims, drawings and summary are incorporated herein by reference in its entirety.

What is claimed is:

1. A semiconductor device including active regions, which regions are separated by isolation regions, the device comprising:
   a dummy pattern which is provided within an inactive region having greater size than a predetermined size and in an annular layout so as to surround an isolation region, wherein
   an isolation region having a width equal to or less than a predetermined width is ensured between the dummy pattern and the active regions surrounding the inactive region.

2. The semiconductor device according to claim 1, wherein the dummy pattern is a single-piece pattern formed in an annular shape.

3. The semiconductor device according to claim 1, wherein the dummy pattern is formed from a plurality of isolated patterns which are arranged in an annular layout.

4. The semiconductor device according to claim 1, wherein the dummy pattern does not have any electrical function.

5. The semiconductor device according to claim 1, wherein the width of the dummy pattern changes in accordance with the size of the isolation region surrounded by the dummy pattern.

6. The semiconductor device according to claim 1, wherein the dummy pattern is formed within only an inactive region which can accommodate a circle having a diameter of 10 μm or more can be formed.

7. A method of manufacturing a semiconductor device including active regions, which regions are separated by isolation regions, the method comprising the steps of:

forming in a semiconductor wafer trenches separating each active region and a dummy pattern;

depositing insulating material for isolation purpose over the entire surface of the semiconductor wafer such that the inside of the trench is filled with the insulating material; and removing the insulating material deposited outside the trench, by means of chemical-and-mechanical polishing, to thereby form an isolation region in the trench, wherein the dummy pattern is provided in an annular layout within an inactive region having greater size than a predetermined size, and an isolation region having a width equal to or less than a predetermined width is formed between the dummy pattern and the active regions surrounding the inactive region.

8. The method according to claim 7, further comprising a step of setting the width of the dummy pattern in accordance with the size of the isolation region surrounded by the dummy pattern.

9. The method according to claim 7, wherein the dummy pattern is formed within only an inactive region which can accommodate a circle having a diameter of 10 μm or more.

* * * * *